United States Patent [19]

Kniepkamp

[11] 3,813,762

[45] June 4, 1974

[54] METHOD OF PRODUCING SCHOTTKY CONTACTS

[75] Inventor: Hermann Kniepkamp, Muenchen, Germany

[73] Assignee: Siemens Aktiengesellschaft, Berlin and Munich, Germany

[22] Filed: Nov. 24, 1971

[21] Appl. No.: 201,886

[30] Foreign Application Priority Data

Nov. 27, 1970 Germany ........................... 2058554

[52] U.S. Cl. ........................ 29/589, 29/590, 29/591, 156/11, 317/235

[51] Int. Cl. ............................ H01l 7/00, H01l 7/50

[58] Field of Search ............ 156/17, 11, 13; 29/590; 117/212; 317/235

[56] References Cited

UNITED STATES PATENTS

| | | | |
|---|---|---|---|
| 3,012,920 | 12/1961 | Christensen et al. | 156/11 |
| 3,599,323 | 8/1971 | Saxena | 29/590 |
| 3,642,528 | 2/1972 | Kimura | 117/212 |

*Primary Examiner*—Jacob H. Steinberg
*Attorney, Agent, or Firm*—Hill, Sherman, Meroni, Gross & Simpson

[57] ABSTRACT

Method of producing metal-semiconductor contacts (Schottky contacts) with precisely defined and relatively small surface areas comprising: applying a layer of an insulating material (aluminum oxide or silicon dioxide) onto a semiconductor surface; etching only areas of the insulating material layer corresponding to the desired contact; coating a layer of chromium onto the exposed semiconductor surface areas and on the non-etched insulating material areas and etching only the areas comprised of a top layer of chromium and a bottom layer of insulating material to produce discrete areas of chromium directly on the semiconductor surface. In one embodiment, the so-formed semiconductor having discrete areas of chromium thereon is further treated by coating another layer of an insulating material over the chromium areas and the semiconductor surface areas, etching only the areas of the insulating material layer generally corresponding to the chromium layer areas and applying a layer of aluminum onto the exposed chromium areas for attachment of feed-line or the like directly onto said aluminum layer.

20 Claims, 8 Drawing Figures

INVENTOR
Hermann Kniepkamp
BY
Hill, Sherman, Meroni, Gross & Simpson
ATTYS.

INVENTOR
Hermann Kniepkamp
BY
Hill, Sherman, Meroni, Gross & Simpson
ATTYS.

METHOD OF PRODUCING SCHOTTKY CONTACTS

BACKGROUND OF THE INVENTION

1. Field of the Invention

The invention relates to production of layers with precisely defined areas and more particularly to the production of such layers with small areas for metal-semiconductor contacts (Schottky contacts) which include chromium on a semiconductor sample.

2. Prior Art

It is known that chromium is a preferred material for the production of metal-semiconductor contacts, particularly for semiconductors comprised of III-V-compound semiconductors. A preferred semiconductor compound from this group is gallium arsenide. In forming metal-semiconductor contacts, so-called Schottky contacts, it is important that no intermediate layers, such as an oxygen layer or the like of the semiconductor are present between a semiconductor material and the metal applied thereon. Such intermediate layers change the quantum mechanical conditions of such a contact in a very decisive manner. While other contact materials are known, such other materials are applied only in a vacuum in the order of $10^{-9}$ Torr whereas chromium is applied in a vacuum of about $10^{-6}$ Torr. The primary reason for this peculiarity is that chromium has an extraordinarily high affinity for oxygen. Any oxygen coating present on the semiconductor material after the conventional heating process in a vacuum of about $10^{-6}$ Torr is consumed by the chromium.

As advantageous as chromium is for the production of Schottky contacts, it is not widely used because of the extreme difficulty in producing precisely defined surface areas thereof, particularly very small area surfaces or strip-like areas comprising closely adjacent contacts. However, metal-semiconductor contacts of such structure are highly desirable, for instance, in integrated circuit application (IC techniques). In such applications, distances between the edges of two or more metal-semiconductor contact areas must be at least as small as about 1$\mu$m or less. This indicates the strict tolerances required for the sharpness of the edges of the contacts.

Generally, precisely defined areas of this species are produced by photo-etch methods wherein a pattern of a desired surface structure is provided by means of selective exposure and dissolution of non-exposed areas of a photo-sensitive etch-resistant material (i.e., a photo-resist) and etching of the exposed material surfaces. However, such photo-etch methods cannot be used for producing precisely defined chromium areas because evaporated chromium layers cannot be etched in precisely defined areas.

The instant invention provides methods of producing metal-semiconductor contacts with precisely defined areas that include chromium on a semiconductor sample, which overcomes the above and additional prior art drawbacks.

SUMMARY OF THE INVENTION

The invention provides metal-semiconductor contacts (Schottky contacts) with precisely defined and particularly small metal areas comprised of a semiconductor substrate, for example, of a III-V-compound, such as gallium arsenide, and a layer of chromium thereon. In certain embodiments, a layer of aluminum is provided onto the chromium layer. Connection elements, such as feed-line wires or the like are attachable, as by thermocompression or ultra-sonic bonding, directly to the aluminum layer.

In accordance with the invention, a semiconductor sample or substrate is treated by first substantially uniformly coating a surface thereof with a layer of photo-etchable insulating material (aluminum oxide or silicon dioxide), etching only areas of the insulating material layer that correspond to the desired contact areas, applying a relatively thin layer of chromium, as by evaporation thereof in a vacuum (about $10^{-6}$ Torr) onto the exposed semiconductor surface areas and the remaining insulating material areas, etching only the areas thereof composed of a top layer of chromium and a bottom layer of insulating material so as to produce discrete precisely defined chromium layer areas directly on the semiconductor surface.

In one specific embodiment, the so-formed semiconductor having discrete chromium layer areas thereon is further processed by overcoating a layer of photo-lithographically etchable insulating material particularly $SiO_2$ over the entire surface thereof, etching only areas of the insulating material layer that generally correspond to the chromium layer areas and applying a layer of aluminum to the exposed chromium areas, as by evaporating aluminum.

The formed semiconductor sample having a plurality of Schottky contacts thereon is divisible into a plurality of elements, each having at least one Schottky contact. Connection elements, such as feed-line wires or the like are attachable directly to the aluminum layer of the contacts as by ultra-sonic or thermo-compression bonding.

In embodiments wherein silicon dioxide comprises the insulating material, a preferred etch-solution is composed of about 250 ml. of 40 percent hydrofluoric acid, 300 g. of ammonium fluoride and 250 ml. of water. In embodiments where aluminum oxide comprises the insulating material, a preferred etch-solution is phosphoric acid of at least about 30 percent concentration, or a solution of hydrofluoric acid buffered with ammonium fluoride.

DESCRIPTION OF THE PREFERRED EMBODIMENTS

Figure 1:
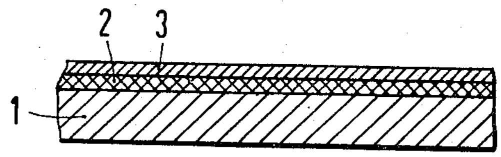
FIG. 1 is an essentially diagrammatic elevation partial view illustrating a step in accordance with an embodiment of the invention in forming a semiconductor sample having a plurality of Schottky contacts thereon.

The principles of the invention reside in lifting selected areas of a chromium layer from a semiconductor surface by etching away a intermediate layer that is first applied onto the semiconductor surface corresponding to such select areas, prior to the application of the chromium layer. Silicon dioxide and aluminum oxide are preferred materials for the intermediate insulating layer because they can be removed or etched by etch-solutions that do not attack chromium.

In accordance with the principles of the invention, the thickness of the insulating material layer is regulated so as to be relatively thick in comparison with the thickness of the chromium layer. The chromium layer is applied around and on the negative pattern of the insulating layer areas as a very thin layer so that the etch-solution for the insulating material can intrude or attack the insulating material through unavoidable holes in the chromium layer at the edges thereof and thereby remove the negative pattern of overlying chromium areas. Once an etch-solution successfully penetrates into the insulating material at one point of an edge thereof, the etching of the remaining insulating layer areas goes on and causes the removal of the overlying chromium layer areas. The fact that the edges of the chromium layer areas directly on the semiconductor surface are very precisely defined is due at least in part to the minor increase in layer thickness at such edges. The chromium layer that is directly on a semiconductor surface is not effected or removed by removal of an adjacent area of insulating material.

In its broader embodiments, the invention comprises applying an etchable insulating layer onto a semiconductor surface, removing areas of the insulating material layer corresponding to desired contact areas, applying a relatively thin chromium layer onto the exposed semiconductor surface areas and onto the remaining insulating layer areas and then removing the areas thereof comprised of a top layer of chromium and a bottom layer of insulating material so that only discrete precisely defined chromium layer areas remain directly on the semiconductor surface.

In accordance with one specific embodiment of the invention, a semiconductor having a plurality of discrete chromium areas thereon (such as formed in accordance with broader embodiments of the invention) is coated with a layer of photo-lithographically etchable insulating material, preferably silicon oxide. This insulating layer covers the chromium areas as well as the semiconductor surface areas in a uniform manner. Areas of the insulating layer that generally correspond to the underlying chromium areas are etched out to expose the chromium areas. Then a coating of aluminum is provided onto the exposed chromium areas, as by evaporating through an appropriate mask.

The insulating material is selected from the group of aluminum oxide and silicon dioxide. In embodiments where silicon dioxide is utilized, a preferred etch-solution is composed of about 250 ml. of 40 percent hydrofluoric acid, about 300 g. of aluminum fluoride and about 250 ml. of water. In embodiments where aluminum oxide is utilized, the etch-solution is either phosphoric acid having concentrations of at least about 30 percent or more, preferably about 85 percent, or a solution of hydrofluoric acid buffered with ammonium fluoride. For example, a preferred buffered hydrofluoric acid solution is composed of a mixture that includes an approximate weight ratio of about one part of 48 percent hydrofluoric acid, about five parts of ammonium fluoride and about seven parts of water. The etch-solutions for the insulating materials do not attack chromium.

The insulating layer is applied by sputtering a selected insulating material (aluminum oxide or silicon dioxide) onto a semiconductor surface, so as to provide a layer thickness of about 100 to 500 nm (nano meters) and preferably about 200 nm. The layer thickness of an insulating material is dependent upon the desired thickness of the chromium layer. Generally, the insulating layer thickness is sufficiently large so as to be a multiple of the chromium layer thickness, and preferably the insulating layer is at least three times the thickness of the chromium layer.

In a preferred embodiment, the insulating material layer is overcoated with a photo-sensitive lacquer (resist) and then selectively exposed to light whereby for example non-exposed areas correspond to the desired contact areas and are removable to certain selected solvents thereby exposing corresponding insulating layer areas for attack by a suitable etch-solution.

The chromium layer is preferably applied by evaporating chromium in a vacuum of about $10^{-6}$ Torr. Generally, a chromium layer thickness of about 20 to 100 nm is applied and preferably the chromium layer has a thickness of about 50 nm.

In embodiments where aluminum layer is applied, it is applied in a thickness sufficient to allow connection elements, such as wires, to be directly attachable to the aluminum layer, as by thermo-compression or ultrasonic bonding. Preferably, the aluminum layer has a thickness of about 50 to 150 nm.

An understanding of further particulars of the invention can be obtained from a consideration of the following description of illustrative examples of the invention.

FIG. 1 illustrates a portion of a semiconductor sample or substrate 1, such as a disk composed of, for example, gallium arsenide. A firmly adhering layer 2 of an insulating material, for example, aluminum oxide, is uniformly applied, as by sputtering aluminum oxide onto the surface of the semiconductor sample 1. The layer 2 is trowled so as to have a uniform thickness of a selected dimension, i.e., about 200 nm. Preferably, a step of tempering is applied after sputtering. In order to etch layer 2 in accordance with the preferred photo-etch process, a layer 3 of a photo-sensitive protective lacquer (i.e., a resist) is applied on top of layer 2.

As is known, selective exposure of a resist to light causes exposed parts thereof to undergo a chemical change so that a solvent for the unexposed resist parts does not dissolve the exposed resist parts. Accordingly, select areas of layer 2 are exposed to light so that the unexposed areas thereof correspond to the desired contact areas and such unexposed areas are then removed by a suitable solvent.

Figure 2:
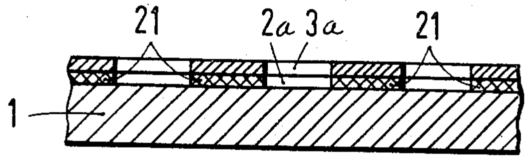
FIG. 2 is a view somewhat similar to FIG. 1 illustrating a further step of the invention.

FIG. 2 illustrates the semiconductor sample 1 having surface areas 2a exposed. Such areas 2*a* are exposed after the unexposed resist layer areas 3*a* are removed and an etch-solution for the aluminum oxide is applied so that the areas of aluminum oxide layer 2 corresponding to the unexposed resist layer areas are removed. During this step, surface areas or holes 2*a* are etched into the layer 2 at locations where areas of layer 3 have been exposed or removed. The aluminum oxide edge surfaces 21 are thus exposed and remain visible through the holes. The section is positioned in such a way that is passes a number of holes so that the sectional surfaces 21 of the aluminum oxide layer remain visible between the holes.

Figure 3:
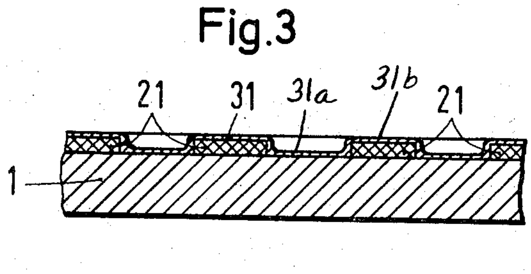
FIG. 3 is a view somewhat similar to FIG. 1 illustrating yet a further step of the invention.

FIG. 3 illustrates the semiconductor 1 in the next sequential step after the exposed resist layer areas 3*b* have been removed, as by a suitable solvent therefor. A thin layer 31 of chromium is applied, as by evaporation in a vacuum over the remaining insulating layer areas 2*b* and the exposed semiconductor surface areas 2*a* in a substantially uniform manner. Direct contact between the semiconductor surface and chromium occurs in the areas 31*a* where the aluminum oxide layer 2 has been etched away.

Figure 4:
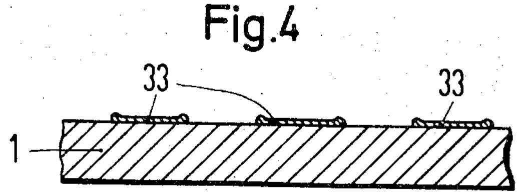
FIG. 4 is an essentially diagrammatic elevational partial view of a semiconductor having a plurality of Schottky contacts thereon formed in accordance with one of the embodiments of the invention.

Thereafter, the layer areas 21 are etched away by a suitable etch-solution for aluminum oxide (such as phosphoric acid having a concentration of about 85 percent). With the removal of the underlying aluminum oxide layer areas 21, the corresponding chromium layer areas 31*b* are lifted off so that only precisely defined discrete chromium layer areas or islands 33 remain, such as illustrated at FIG. 4. It will be noted that all areas of the chromium layer 31 that were in contact with the insulating aluminum oxide layer 2 (i.e., areas 21 thereof) are completely and precisely removed. Only chromium layer areas 31*a* that were in direct surface contact with the semiconductor surface remain thereon. In embodiments where holes have been etched into, for example, an aluminum oxide layer so that the holes are spaced from each other, discrete and insulated chromium islands 33 are produced on a semiconductor sample. The so-formed semiconductor sample having a plurality of Schottky contacts thereon is divisible into a plurality of semiconductor elements, each having at least one Schottky contact thereon.

Figure 5:
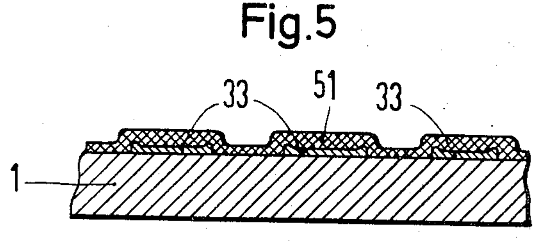
FIG. 5 is an essentially diagrammatic elevational partial view of a step in accordance with another embodiment of the invention in forming a semiconductor sample having a plurality of Schottky contacts thereon.

As illustrated in FIG. 5, another embodiment of the invention comprises coating a semiconductor sample 1 having a plurality of discrete chromium islands 33 thereon with an insulating layer 51 preferably composed of silicon dioxide. The insulating layer 51 substantially uniformly covers the exposed semiconductor surface areas as well as the exposed chromium layer islands. Silicon dioxide is preferable as the insulating material because of its low dielectric constant.

Figure 6:
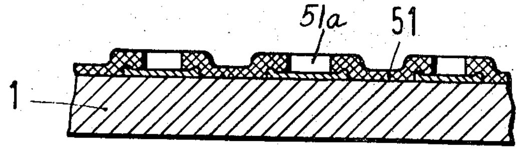
FIG. 6 is a view somewhat similar to FIG. 5 illustrating a further step in accordance with the other embodiments of the invention.

FIG. 6 illustrates the next sequential step of this embodiment, after holes 51*a* have been etched into the layer 51. Holes 51*a* are generally located in areas corresponding to the location of the chromium islands 33. The holes 51*a* have a maximum surface dimension somewhat less than the surface dimension of the chromium islands 33 and do not extend beyond the periphery of the islands 33. The holes 51*a* are preferably produced by the photo-etching process wherein a resist layer (not shown) is applied onto the insulating layer 51, exposed to a light pattern and the unexposed parts thereof are removed to uncover corresponding chromium island areas. The light exposure can be regulated by an appropriate mask since positioning of the unexposed areas does not have to be extremely precise because the holes need only cover parts of the surface area of the chromium islands.

Figure 7:
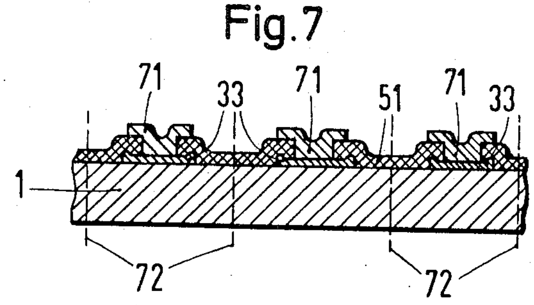
FIG. 7 is a view somewhat similar to FIG. 5 illustrating yet a further step in accordance with the other embodiments of the invention.

FIG. 7 illustrates the next sequential step of this embodiment wherein layer areas 71 of aluminum are applied onto the exposed chromium island areas 33. As shown, the semiconductor sample 1 has chromium islands 33 in direct surface contact therewith and a discontinuous silicon dioxide layer 51 on parts of the chromium island 33 and on the semiconductor surface areas separating the island 33. The holes in the silicon oxide layer 51 are filled with a layer 71 of aluminum. This aluminum layer results in a fixed contact on the chromium islands 33. The aluminum is preferably applied with a suitable mask, as by evaporating aluminum through the mask until an aluminum layer of a sufficient thickness is formed. The thickness of the aluminum layer must be sufficiently great to allow direct attachment of a connecting element, such as a wire thereto. Generally, the aluminum layer ranges in thickness between 50 to 150 nm and is preferably about 100 nm. As shown along the dotted lines 72, the formed semiconductor sample having a plurality of Schottky contacts thereon is divisible into individual semiconductor elements, each having at least one contact thereon.

Where Schottky contacts are formed on a semiconductor substrate by combining the embodiment illustrated in FIGS. 1–4 and the embodiment illustrated in FIGS. 5–6, it is preferable to use silicon dioxide as the insulating material throughout the entire process so that an identical etch-solution can be utilized for removal of this insulating material throughout the process.

Figure 8:
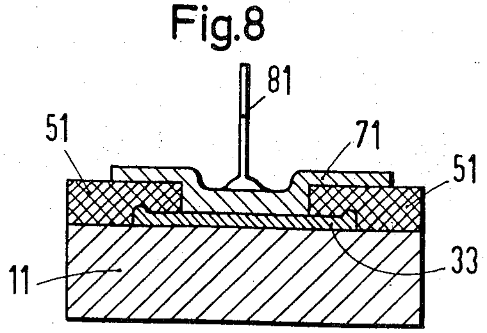
FIG. 8 is an essentially diagrammatic elevational view of a formed element having a Schottky contact thereon formed in accordance with the other embodiment of the invention.

FIG. 8 illustrates a section of a diode element having a Schottky-Barrier contact thereon. The diode element is comprised of a semiconductor base sample 11 (a divided portion of semiconductor sample 1) having a chromium island 33 in direct contact with a part of its surface. A discontinuous silicon dioxide layer 51 covers the other parts of the surface of the semiconductor base sample 11 and slightly overlaps peripheral edges of the chromium island 33, but leaves the center parts of the island 33 free. An aluminum layer 71 covers the free chromium island parts and overlaps parts of the adjacent silicon dioxide layer 51. A connection element, such as a feed-line wire 81, is directly attached to the aluminum layer 71, as by thermo-compression or ultra-sonic bonding. Silicon dioxide is a preferred insulating material for this embodiment because of its low dielectric constant.

Modifications, variations and changes may be made to the described embodiments without departing from the spirit and scope of the novel concepts of the invention.

I claim:

1. A method of producing metal-semiconductor contacts with precisely defined relatively small surface areas that include chromium on a semiconductor substrate comprising the sequential steps of; (1) applying a relatively thick layer of photo-lithographically etchable-insulating material selected from the group consisting of aluminum oxide and silicon dioxide onto a semiconductor surface; (2) etching areas of the insulating material layer corresponding to the desired contact areas until corresponding areas of the semiconductor surface are exposed; (3) coating a relatively thin layer of chromium onto the exposed semiconductor surface areas and onto remaining insulating material layer areas; and (4) etching the remaining areas of insulating material until the insulating material overlying areas of chromium are removed and corresponding areas of the semiconductor surface are exposed so that discrete precisely defined areas of chromium remain on said semiconductor surface.

2. A method as defined in claim 1 wherein the insulating material is aluminum oxide.

3. A method as defined in claim 2 wherein the aluminum oxide layer is etched at steps (2) and (4) with a buffered hydrofluoric acid.

4. A method as defined in claim 3 wherein the buffered hydrofluoric acid includes ammonium fluoride as a buffering agent.

5. A method as defined in claim 4 wherein the buffered hydrofluoric acid is comprised of a mixture having an approximate weight ratio of about one part of 48 percent hydrofluoric acid, about five parts of ammonium fluoride and about seven parts of water.

6. A method as defined in claim 2 wherein the aluminum oxide layer is etched at steps (2) and (4) with phosphoric acid having a concentration of at least 30 percent.

7. A method as defined in claim 6 wherein the phosphoric acid has a concentration of about 85 percent.

8. A method as defined in claim 1 wherein the insulating material is silicon dioxide.

9. A method as defined in claim 8 wherein the silicon dioxide layer is etched at steps (2) and (4) with an etch-solution comprised of a mixture of hydrofluoric acid, ammonium fluoride and water.

10. A method as defined in claim 1 wherein the formed semiconductor surface having discrete areas of chromium thereon after step (4) is further treated by steps; (5) substantially uniformly coating a layer of a photo-lithographically etchable-insulating material selected from the group consisting of aluminum oxide and silicon dioxide on the exposed semiconductor surfaces areas and the discrete chromium areas; (6) etching areas of the insulating material layer that generally correspond to the discrete chromium areas to expose at least parts of said chromium areas; and (7) coating a layer of aluminum at least onto the exposed parts of the discrete chromium areas.

11. A method as defined in claim 10 wherein the insulating material in steps (1) and (5) is silicon dioxide applied in a layer thickness of about 100 to 500 nm.

12. A method as defined in claim 10 wherein the aluminum layer has a thickness of about 50 to 150 nm.

13. A method as defined in claim 1 wherein the insulating material is applied by sputtering said material onto the semiconductor surface and then tempering the resulting layer of said material.

14. A method as defined in claim 1 wherein the chromium layer is applied by evaporation.

15. A method as defined in claim 1 wherein the insulating material layer has a thickness of about 100 to 500 nm and the chromium layer has a thickness of about 20 to 100 nm.

16. A method as defined in claim 1 wherein the chromium layer has a thickness of about 50 nm and the insulating material layer has a thickness that is at least a multiple of three of said chromium layer thickness.

17. A method of producing metal-semiconductor contacts with precisely defined relatively small surface areas that include chromium on a semiconductor member, comprising the sequential steps of; (1) applying a layer of an insulating material selected from the group of aluminum oxide and silicon dioxide onto a semiconductor surface in a thickness of about 100 to 500 nm; (2) applying a layer of a photo-sensitive resist material onto the insulating material layer, selectively exposing areas of said resist material layer to light so that unexposed areas thereof correspond to desired contact areas, and removing the unexposed areas to expose corresponding insulating material areas; (3) etching the exposed insulating material areas with an etch-solution for said insulating material until corresponding areas of the semiconductor surface are exposed, and removing the exposed areas of the resist material layer to uncover corresponding insulating material areas; (4) evaporating a layer of chromium onto the exposed semiconductor surfaces and onto uncovered insulating material layer areas in a thickness of about 20 to 100 nm; and (5) removing the remained areas of insulating material with an etch-solution for said insulating material until corresponding areas of semiconductor surface are exposed and discrete areas of chromium remain on said semiconductor surface.

18. A method as defined in claim 17 including (6) dividing the formed semiconductor sample having chromium-semiconductor contacts thereon into component elements, each comprised of a semiconductor sample having at least one chromium-semiconductor contact thereon.

19. A method of producing metal-semiconductor contacts with precisely defined relatively small surface areas that include chromium on a semiconductor substrate; comprise the sequential steps of; (1) applying a layer of silicon dioxide onto a semiconductor surface in a thickness of about 100 to 500 nm; (2) applying a layer of a photo-sensitive resist material onto the silicon dioxide layer, selectively exposing areas of said resist material layer to light so that unexposed areas thereof correspond to desired contact areas and removing the unexposed areas to expose corresponding silicon dioxide areas; (3) etching the exposed silicon dioxide layer areas with an etch-solution comprised of a mixture of hydrofluoric acid, ammonium fluoride and water until corresponding areas of the semiconductor surface are exposed and removing the exposed areas of the resist material layer to uncover corresponding silicon dioxide layer areas; (4) evaporating a layer of chromium onto the exposed semiconductor surface areas and onto uncovered silicon dioxide layer areas in a thickness of about 20 to 100 nm; (5) removing the areas of insulating material with said etch-solution until corresponding areas of semiconductor surface are exposed and discrete areas of chromium remain on said semiconductor surface; (6) applying a coating of silicon dioxide over the exposed semiconductor surface areas and the discrete chromium areas; (7) applying a layer of a photo-sensitive resist material onto said silicon dioxide layer, selectively exposing areas of said resist material layer to light so that unexposed areas thereof generally correspond to the discrete chromium areas, and removing said unexposed areas to expose corresponding areas of the silicon dioxide layer; (8) etching the exposed silicon dioxide layer areas with said etch-solution to expose at least portions of the discrete chromium areas; and (9) evaporating a layer of aluminum onto at least said exposed chromium area portions in a thickness of about 50 to 100 nm.

20. A method as defined in claim 19 wherein a connection element is attached directly to the aluminum layer.

* * * * *